United States Patent [19]
Hanyu et al.

[11] Patent Number: 5,428,478
[45] Date of Patent: Jun. 27, 1995

[54] OPTICAL MASK AND EXPOSURE METHOD USING THE OPTICAL MASK

[75] Inventors: Isamu Hanyu; Satoru Asai, both of Kawasaki, Japan

[73] Assignee: Fujitsu, Ltd., Kawasaki, Japan

[21] Appl. No.: 118,173

[22] Filed: Sep. 9, 1993

[30] Foreign Application Priority Data

Sep. 10, 1992 [JP] Japan .................. 4-241796

[51] Int. Cl.⁶ .................................. G02B 27/44
[52] U.S. Cl. .................. 359/565; 359/566; 359/742
[58] Field of Search ............ 359/565, 566, 741, 742

[56] References Cited

U.S. PATENT DOCUMENTS 5,073,007 12/1991 Kedmi et al. .................. 359/742
5,218,471 6/1993 Swanson et al. .................. 359/742

OTHER PUBLICATIONS

Watanabe et al., "Transparent phase shifting mask with multi-stage phase shifter and comb-shaped shifter", SPIE, vol. 1463, pp. 101–110, 1991, Japan.

Miyazaki et al., "A new phase shifting Mask Structure for Positive Resist Process", SPIE, vol. 1464, pp. 327–335, 1991, Japan.

Terasawa et al., "Variable Phase-Shift Mask for deep sub-micron optical lithography", SPIE, vol. 1463, pp. 197–206, 1991, Japan.

Primary Examiner—Scott J. Sugarman
Assistant Examiner—Thomas Robbins
Attorney, Agent, or Firm—Staas & Halsey

[57] ABSTRACT

An optical mask including a $2\pi n$ phase shifter pattern, a $\pi(2n+1)$ phase shifter pattern, an intermediate phase shifter pattern which shifts the phase of an incident light by an angle between $2\pi n$ and $\pi(2n+1)$, and a reversed intermediate phase shifter pattern which shifts the phase of an incident light by an angle being reversed by $\pi$ for the phase shift angle of the intermediate phase shifter pattern. The intermediate phase shifter patterns are formed in the vicinity of the reversed intermediate phase shifter patterns having light shielding films in between.

16 Claims, 10 Drawing Sheets

F I G. 14
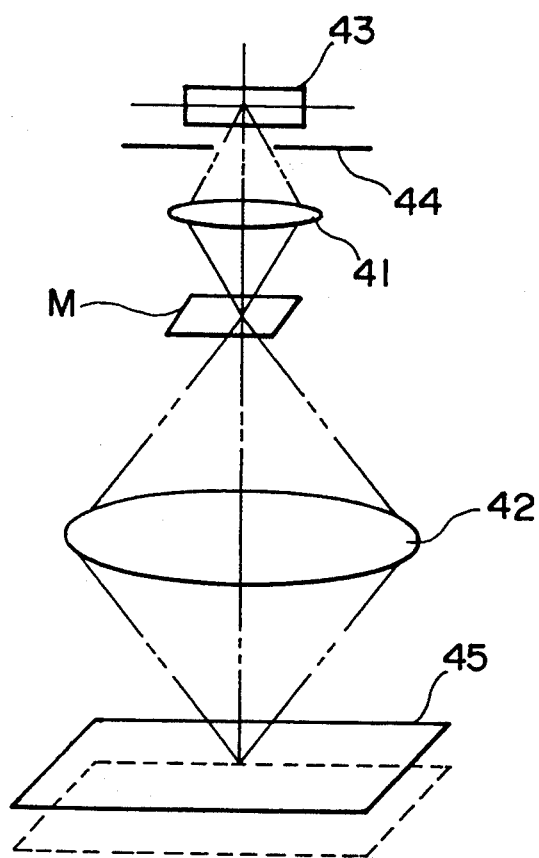

OPTICAL MASK AND EXPOSURE METHOD USING THE OPTICAL MASK

BACKGROUND OF THE INVENTION

1. Field of the Invention

The present invention relates to an optical mask and an exposure method using the optical mask, and more particularly, it relates to an optical mask for exposing resist to be used for the production of a semiconductor device, etc., and to exposure methods using the optical mask.

2. Description of the Related Art

In the development of VLSI's in recent years, it has become necessary to form patterns having dimensions of less than a half micron to realize high speed operation and high integration density. In order to realize such miniaturization, in the process of lithography, a basic method for pattern formation, it is indispensable to adopt an exposure system of reduction-type projection which is excellent in mass production and resolution.

However, the demand for miniaturization has outpaced the progress of devices. Thereby, the formation of a pattern size which surpasses the nominal resolution of a reduction-type projection exposure system is required, and it is necessary to draw out the performance of the system to the limit by the improvement in a resist material or a resist process. A phase shift exposure method is used in which a phase shift plate for reversing the phase of an exposure light is provided in a part of an optical mask as a technique to improve the limit of the performance of the system.

In the phase shift exposure method, an optical mask being disposed with transparent patterns of different phase shift angles is used. However, when the method is applied to an actual production of VLSI's, in some cases there is a difficulty in disposing the phase shifter patterns on a mask with consistency.

For example, when a pattern to be used for a semiconductor integrated circuit is separated into a plurality of parts and phase shifter patterns of 0° and 180° are disposed in respective parts, in some parts it can occur that a 0° phase shifter pattern and a 180° phase shifter pattern share a border with each other. A pattern which shifts the phase of a light by X° is called an X° phase shifter pattern.

In the above-mentioned contiguous part, the lights having different phase angles of 0° and 180° come in, so that the intensity of the light which passes through the contiguous part is remarkably lowered. Two methods can be considered to solve such a problem: one is to dispose a phase shifter pattern having a neutral phase angle, 90°, in the contiguous part of the 0° phase shifter pattern and the 180° phase shifter pattern; another one is to make a double exposure on the contiguous part using another optical mask. When the double exposure method is adopted, exposure is performed twice in changing optical masks, so that the throughput is decreased, and further, the alignment of masks is difficult and, thus, the through-put is lowered.

Therefore, an optical mask having a 90° phase shifter pattern is generally adopted. The system is called a multistage system, and the system is proposed in the following papers, for example.

[1] SPIE vol.1463, 1991, pp101–110, H. Watanabe et al., "Transparent phase shifting mask with multistage phase shifter and comb-shaped shifter".

[2] SPIE vol.1463, 1991, pp327–335, J. Miyazaki et al., "A New phase-shifting Mask Structure for Positive Resist Process".

[3] SPIE vol.1463, 1991, pp197–206 "Variable Phase-Shift Mask for deep sub-micron optical lithography".

The examples of optical masks having 90° phase shifter patterns are shown in FIGS. 1A, 2 and 3.

FIG. 1A shows a side of an optical mask for forming a pattern of lines and spaces. A plurality of transparent straight line patterns 101 are disposed having light shielding areas 102 in between. A 0° phase shifter 103 and a 180° phase shifter 104 are formed on each of the transparent patterns 101, and in the contiguous part of the 0° phase shifter 103 and the 180° phase shifter 104, a 90° phase shifter 105 is disposed. The 0° phase shifters 103 and 180° phase shifters 104 are alternately disposed in the line width direction (up and down in FIG. 1).

In the case of this optical mask, 90° phase shifters 105 are disposed in line in the direction of the line width, so that the lights which pass through the 90° phase shifters 105 are diffracted to turn into the back of the light shielding areas 102 and the lights are superposed to strengthen each other. Further, the intensity of the light which is passed through the 90° phase shifter 105 becomes small, as shown in FIG. 1B, influenced by the diffracted light. As a result, exposure margin is lowered and the probability of occurrence of a defect in a pattern is increased.

It is possible to dispose 90° phase shifters 105 in zig-zag in the direction of the pattern width (see FIG. 2). However, in that case, phase shifters 103, 104 and 105 having a phase difference of 90° from each other are disposed in the direction of the pattern width with light shielding areas 102 in between, so that in comparison with the case of 180° phase difference the effect of phase shifters is decreased. Thereby, the decrease in exposure margin cannot be avoided.

An optical mask shown in FIG. 3 comprises 2-comb shaped transparent patterns 106 being disposed as if the spine parts of the 2 combs are disposed facing each other, and the surroundings of the transparent patterns 106 are formed with light shielding areas 107.

In the spine parts, the (y) direction of the transparent patterns 106 having the shape of 2 combs, there are formed 0° phase shifters 108 and 180° phase shifters 109 alternately disposed along the (y) direction and being extended in the (x) direction. Further, among the line patterns in the (y) direction corresponding to the spine parts, in the part which is contiguous with 0° phase shifters 108, there are disposed 90° phase shifters 110, and in the other parts, 180° phase shifters 109 are disposed and extend to the 90° phase shifters 110.

In the case of this optical mask, on the back of a light shielding portion 111, which is disposed between the transparent patterns 106 having the shape of 2 combs, the lights being passed through the phase shifters 108, 109 and 110, disposed on both sides of the light shielding portion 111 and having the phase difference of 90° from each other, are diffracted and superimposed on each other, so that the exposure margin is lowered.

SUMMARY OF THE INVENTION

It is an object of the present invention to provide an optical mask of high exposure margin and an exposure method using the mask, when phase shifter patterns are used.

The present invention comprises $2\pi n$ phase shifter patterns and $\pi(2n+1)$ phase shifter patterns, and also comprises intermediate phase shifter patterns having a phase shift angle in the range of $2\pi n$ to $\pi(2n+1)$ and reversed intermediate phase shifter patterns which are obtained by reversing the above-mentioned intermediate phase shift angles by $\pi$.

When a contiguous part of a $2\pi n$ phase shifter pattern and a $\pi(2n+1)$ phase shifter pattern, and another contiguous part of a $2\pi n$ phase shifter pattern and a $\pi(2n+1)$ phase shift pattern come close to each other, an intermediate phase shifter pattern or a reversed intermediate phase shifter pattern is disposed in the respective contiguous parts. Since the phase angles of the lights which are passed through these contiguous parts differ by $\pi$ each other, the lights which are passed by diffraction through the phase shifter patterns cancel each other at the light shielding areas.

Therefore, the light intensity in the light shielding area which lies between a contiguous part of a $2\pi n$ phase shifter pattern and a $\pi(2n+1)$ phase shifter pattern, and another contiguous part of a $2\pi n$ phase shifter pattern and a $\pi(2n+1)$ phase shifter pattern becomes weak. Moreover, in an intermediate phase shifter pattern and in a reversed intermediate phase shifter pattern in the contiguous part, diffracted lights are added and the lowering of light intensity is restrained. Thereby, exposure margin is increased.

BRIEF DESCRIPTION OF THE DRAWINGS

FIG. 14 is a constitutional drawing showing an exposure method using an optical mask according to the present invention.

DESCRIPTION OF THE PREFERRED EMBODIMENTS

Embodiment 1

Figure 4:
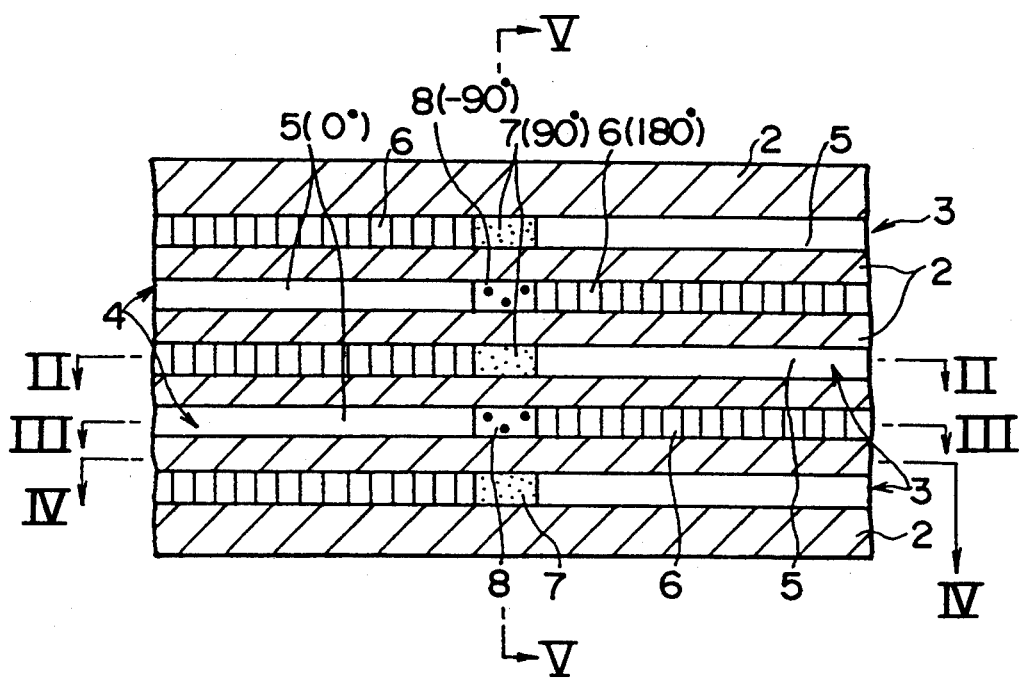
FIG. 4 is a plan view of an optical mask showing a first embodiment according to the present invention.

FIG. 4 is a sectional plan view of an optical mask showing the first embodiment according to the present invention.

The optical mask comprises a quartz substrate 8 to be a $-90°$ phase shifter, a light shielding film 2 composed of chromium formed on the quartz substrate 8, and a plurality of transparent patterns, 3 and 4, of straight line shapes formed in parallel at intervals in the light shielding film 2. The optical mask is so constituted that the light incident on the quartz substrate 8 is output through the transparent patterns, 3 and 4.

A 0° phase shifter 5 and a 180° phase shifter 6 are provided on respective transparent patterns, 3 and 4, and the 0° phase shifter 5 and another 0° phase shifter 5 or a 180° phase shifter 6 and another 180° phase shifter 6 are arranged not to be adjacent to each other in the line width direction (up and down in FIG. 4). Moreover, in respective transparent patterns, contiguous parts of 0° phase shifters 5 and 180° phase shifters 6 are disposed in line in the line width direction, and in respective contiguous parts, 90° phase shifters 7 and $-90°$ phase shifters (in this instance, the quartz substrate acts as a $-90°$ phase shifter) 8 are disposed alternately not to be adjacent to each other in the line width direction.

The above-mentioned 0° phase shifter 5, 90° phase shifter 7 and 180° phase shifter 6 are formed with SiO$_2$ films, 10, 11 and 12, for example, as shown in FIGS. 5A to 5D and are able to shift the phases of lights incident on them by 0°, 90° or 180°, respectively. These phase differences are adjusted by the differences in thickness among the quartz substrate 1 and three SiO$_2$ films, 10, 11 and 12.

Next, the operation of the above-mentioned optical mask will be explained.

When the above-mentioned optical mask is used, the lights which pass through the transparent patterns 3 and 4 turn into the back of the light shielding film 2, which lies between the transparent patterns 3 and 4, by diffraction. However, the phases of the lights which are passed through the adjacent transparent patterns 3 and 4 in the pattern width direction are reversed by 180° by four kinds of phase shifters 5, 6, 7 and 8, so that the lights which turn into the back of the light shielding film 2 lying between the transparent patterns 3 and 4 cancel each other. Thereby the exposure margin is not deteriorated by phase shifters.

In the case of transparent patterns, 3 and 4, in the contiguous part of a 0° phase shifter 5 and a 180° phase shifter 6, there is provided either a 90° phase shifter 7 or a $-90°$ phase shifter 8, so that in the contiguous part, the canceling quantity of lights which pass through the 0° phase shifter 5 and the 180° phase shifter 6 by diffraction is decreased.

Moreover, the 90° phase shifters 7 and the $-90°$ phase shifters 8 are disposed in line in the width direction of the transparent patterns, 3 and 4, so that the lights which are passed through them and turn into the back of the light shielding film 2, which is disposed between the patterns 3 and 4, by diffraction, cancel each other. The light intensity on the back of the light shielding film 2 is lowered enough not to bother exposure.

The widths and intervals of a plurality of transparent patterns, 3 and 4, that is, the widths of the lines and spaces are assumed to be 0.35 μm, and the lengths of the 90° phase shifter 7 and the −90° phase shifter 8 in the line direction (lateral direction in the figure) are assumed to be 0.4 μm, and the light intensity by exposure is obtained by calculation. The light intensity along the II—II line of the transparent pattern 3 is obtained as shown with a solid line in FIG. 6, when there is no dislocation of focus. The intensity is larger than that shown in the embodiment in FIG. 1B in the case of a conventional optical mask where the −90° phase shifters are not provided.

Figure 1A:
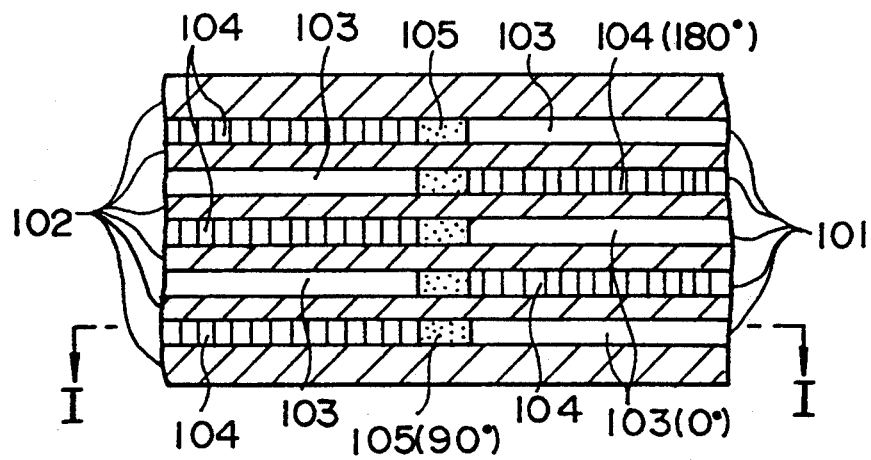
FIG. 1A is a plan view showing a first conventional optical mask.
Figure 1B:
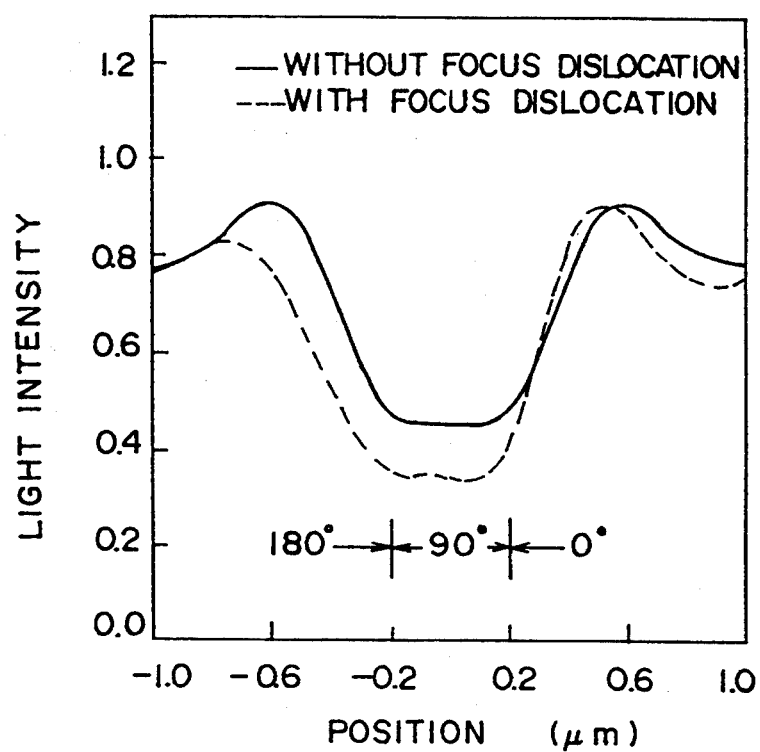
FIG. 1B is a light intensity distribution chart of the light which is passed through the I—I line part in FIG. 1A.
Figure 2:
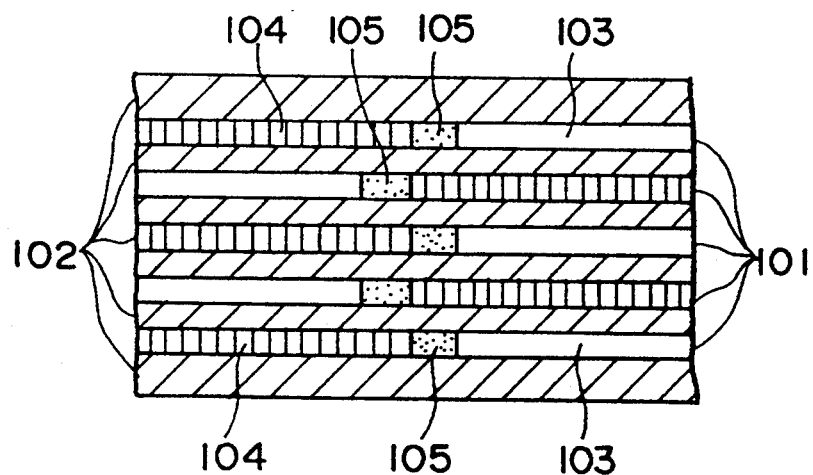
FIG. 2 is a plan view showing a second conventional optical mask.
Figure 3:
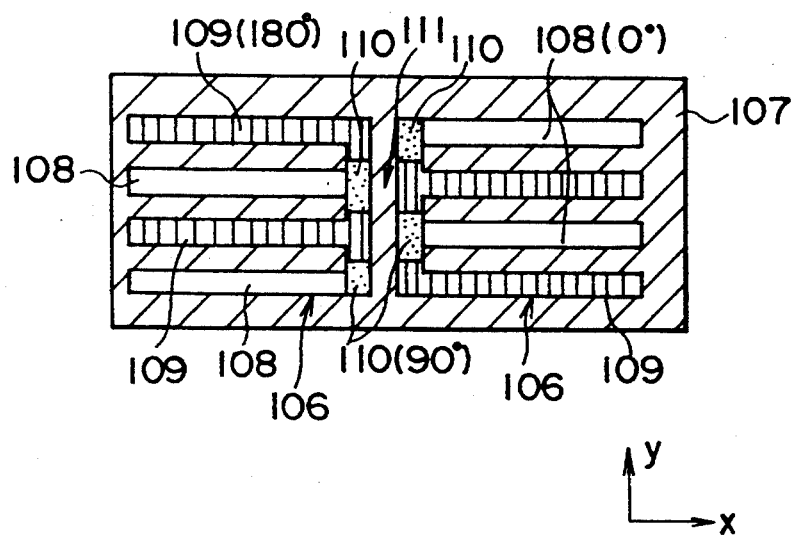
FIG. 3 is a plan view showing a third conventional optical mask.
Figure 6:
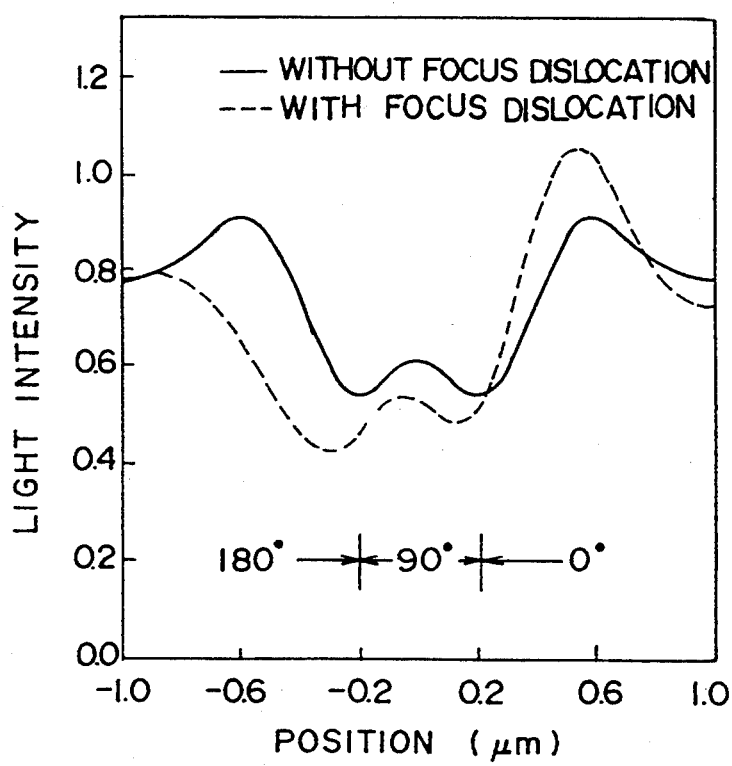
FIG. 6 is a light intensity distribution chart of the light which is passed through the cross sectional part taken on II—II line of the optical mask in the first embodiment according to the present invention shown in FIG. 4.

When there is dislocation of focus of 0.75 μm as shown with broken lines in FIG. 6 and FIG. 1B, the light intensity in the present embodiment where −90° phase shifters and 90° phase shifters are provided alternately is larger in comparison with that in the conventional case, and it is found that the light intensity is strong enough to open a resist, an object of exposure.

The numerical aperture of a lens in the case of exposure is 0.54 and the coherence factor $\sigma$ is 0.3, and i ray (wavelength: 365 nm) is used as an exposure light.

Next, a method of forming an optical mask to be used for the above-mentioned i ray will be explained based on FIGS. 7A to 7E and 8A to 8E. FIGS. 7A to 7E show corresponding parts to the cross sectional view taken on line II—II in FIG. 4. FIGS. 8A to 8E show corresponding parts to the cross sectional view taken on line III—III in FIG. 4. A sectional view taken on line IV—IV where there is the light shielding film 2 is not shown in a drawing, because finally there is only the existence of the light shielding film 2 left.

Figure 7A:
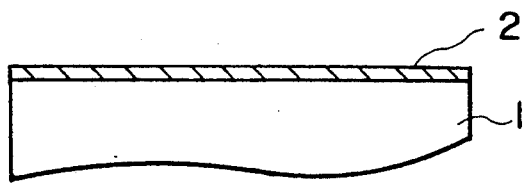
FIGS. 7A to 7E are cross sectional views showing the formation process of the cross sectional part taken on II—II line of the optical mask shown in FIG. 4.
Figure 8A:
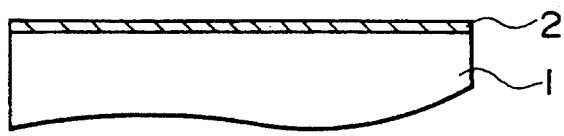
FIGS. 8A to 8E are cross sectional views showing the formation process of the cross sectional part taken on III—III line of the optical mask shown in FIG. 4.

At first, as shown in FIG. 7A and FIG. 8A, the light shielding film 2, composed of chromium, is laminated on the whole area of the quartz substrate 1 (this quartz substrate being the same quartz substrate 8 in FIG. 4).

Next, the light shielding film 2 is patterned by a photolithography method and a plurality of straight line transparent patterns 3 and 4 are opened at predetermined intervals. The widths of these transparent patterns 3 and 4 and those of the intervals are made to be 0.35 m.

Figure 7B:
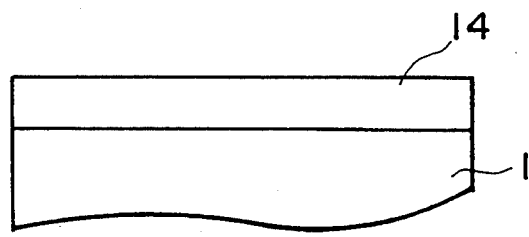
Figure 8B:
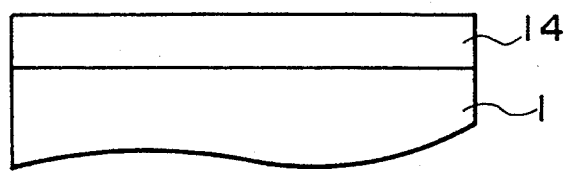

Next, on the whole surface of the quartz substrate 1, a SiO$_2$ film 14, to function as phase shifters, is laminated to have a thickness of 5700 Å by the CVD method. In this case, the cross sectional views of two transparent patterns 3 and 4 are as shown in FIG. 7B and FIG. 8B.

Figure 7C:
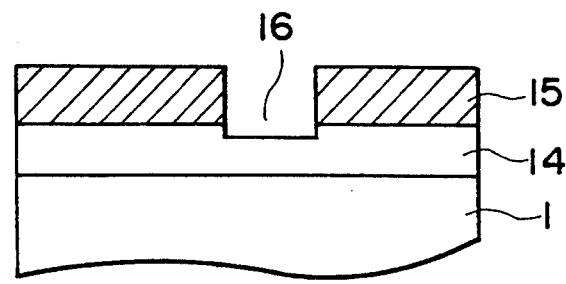
Figure 8C:
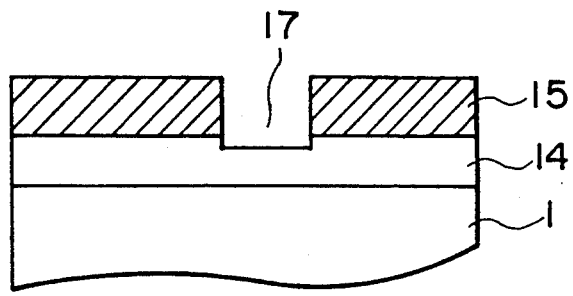

Following this, as shown in FIG. 7C and FIG. 8C, photoresist 15 is applied on the whole surface of SiO$_2$ film 14, and windows 16 and 17 are formed by exposure and development in the area where 90° phase shifters and −90° phase shifters are to be formed, and another window which is not shown in a drawing is formed in the area where the light shielding film 2 is left. The part of the SiO$_2$ film 14 exposed through windows, 16 and 17, is thinned by 1900 Å by a dry etching method.

Figure 7D:
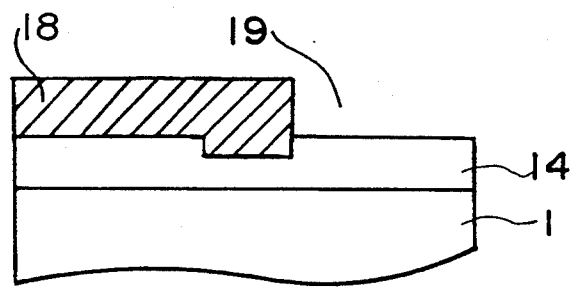
Figure 8D:
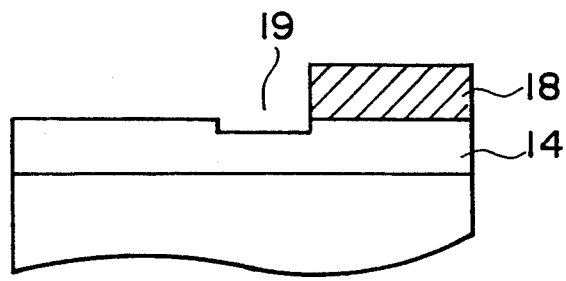

After the photoresist 15 is exfoliated, photoresist 18 is applied as shown in FIG. 7D and FIG. 8D, and a window 19 is formed by exposure and development in a place where 0° phase shifters 5 and −90° phase shifters 8 are to be formed. In this case also, a window not shown in a drawing is formed in an area where the light shielding film 2 is left.

Next, the SiO$_2$ film 14 which is exposed through the window 19 is removed by the thickness of 3800 Å by etching to leave the SiO$_2$ film 14 having the thickness of 1900 Å in the area where the 0° phase shifters 5 are to be formed, and the SiO$_2$ film 14 is completely removed to expose the surface of the quartz substrate 1 in the area where −90° phase shifters are to be formed and in the area where there is left the light shielding film 2.

Figure 7E:
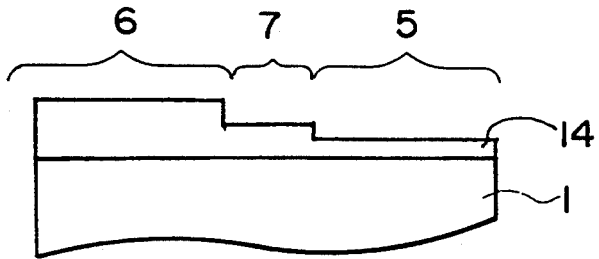
Figure 8E:
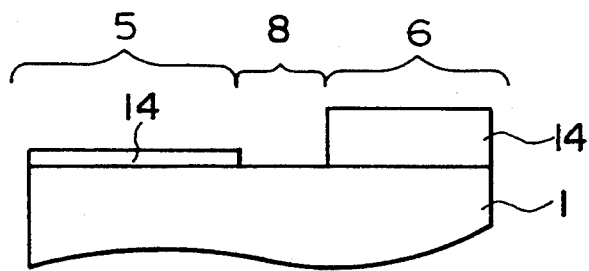

When the photoresist 18 is exfoliated in the last step, in the two transparent patterns 3 and 4, phase shifters composed of the quartz substrate 1 and the SiO$_2$ film 14 of different thicknesses are formed as shown in FIG. 7E and FIG. 8E; thus an optical mask as shown in FIG. 4 and FIGS. 5A to 5D is completed.

In the case of a 180° phase shifter, the thickness of SiO$_2$ film d can be obtained by an expression, $d = \lambda/2(n-1)$, ($\lambda$: the wavelength of an exposure light, n: the index of refraction of a phase shifter material). Therefore, when i ray is used as an exposure light, an SiO$_2$ film of thickness of 1900 Å gives a phase difference of 90°.

In the explanation described in the above, 90° and −90° phase shifters are formed as intermediate phase shifters between the phase shifters of 0° and 180°, and also in a case where phase shifters of 90° and 270° are used, the same result can be obtained.

Embodiment 2

Figure 9:
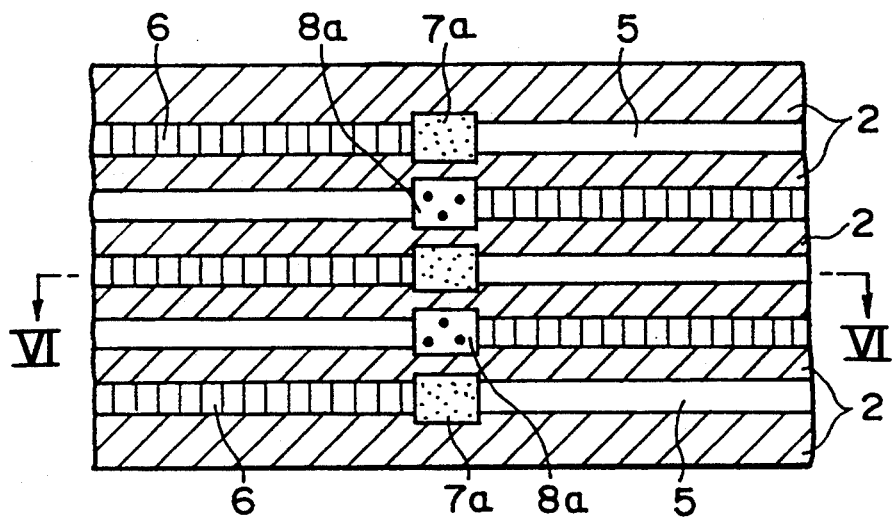
FIG. 9 is a plan view of an optical mask showing a second embodiment according to the present invention.
Figure 10:
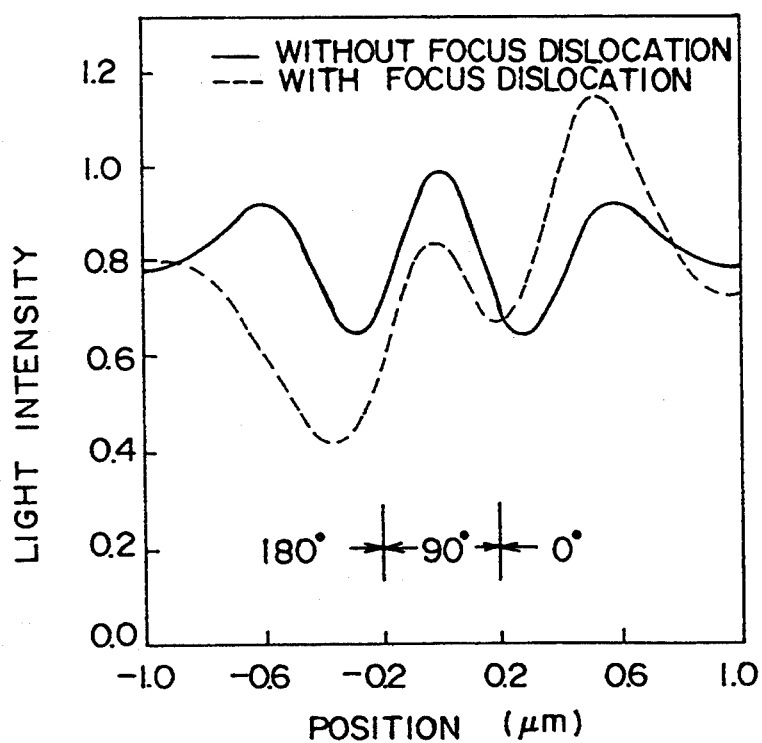
FIG. 10 is a light intensity distribution chart of the light which is passed through the cross sectional part taken on VI—VI line of the optical mask in the second embodiment according to the present invention shown in FIG. 9.

FIG. 9 is a plan view of an optical mask according to a second embodiment, and FIG. 10 is a light intensity distribution chart of a transmitted light through a mask on line VI—VI in FIG. 9.

In FIG. 9, a numeral 7a denotes a 90° phase shifter and 8a denotes a −90° phase shifter, and a different point from the embodiment 1 is that the widths of the phase shifters are made wider than those of the transparent patterns, 3 and 4. In FIG. 9, the elements expressed with the same symbols as those in FIG. 4 show the same elements. The calculation of light intensity is performed under the same conditions as those in the embodiment 1 using an optical mask as described in the above. According to the result of investigation, the light intensity of a light which is transmitted through the transparent patterns along line VI—VI is as shown in FIG. 10. A light distribution chart written with a solid line shows the case where there is no dislocation of focus, and the exposure margin is larger than that in the embodiment 1. The chart written with a broken line shows a case where there is dislocation of focus of 0.75 μm, and the falling depth of light intensity in the 90° phase shift area becomes smaller in comparison with the light intensity in the case of the conventional optical mask shown in FIG. 1B, and exposure margin is further improved.

Embodiment 3

Figure 11:
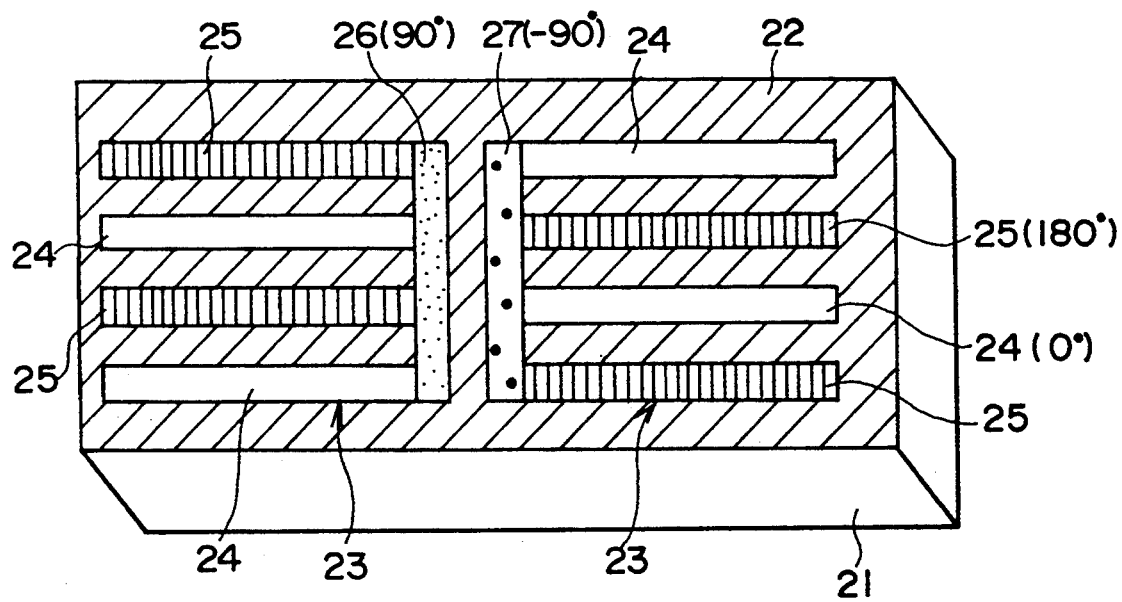
FIG. 11 is a plan view of an optical mask showing a third embodiment according to the present invention.
Figure 11:
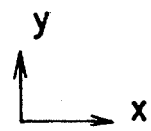

FIG. 11 is a plan view showing an optical mask used in the third embodiment according to the present invention.

In FIG. 11, a reference numeral 21 is a quartz substrate to be used as a −90° phase shifter, and over it, a light shielding film 22 composed of chromium is formed. On the light shielding film 22, transparent patterns 23 having a shape of two combs are formed, and the spine parts of the transparent patterns 23 are disposed to face each other with the light shielding film 22 in between.

In the spine parts disposed in the (y) direction of the transparent patterns 23 having a shape of 2 combs, 0° phase shifters 24 and 180° phase shifters 25 extending straight in the (x) direction are alternately formed in (y) direction. Further, in the two patterns disposed in (y) direction corresponding to spine parts of the transparent patterns 23, one is a 90° phase shifter 26, and the other is a −90° phase shifter 27. The (x) direction shows a direction making a right angle with the (y) direction.

When an optical mask as described in the above is used, phase difference between 2 patterns in the (y) direction facing each other with the light shielding film 22 in between is 180°, so that the lights turn into the back of the area between them and cancel each other and the light intensity in the area is lowered, and the degrees of intensity of lights which are passed through the 90° phase shifter 26 and the −90° phase shifter 27 are made high by the diffracted light. As a result, exposure margin is made large and the probability of occurrence of a defect in a pattern is much decreased.

Embodiment 4

In the above-mentioned embodiments, 90° phase shifters and −90° phase shifters are disposed in a plurality of contiguous parts of 0° (2πn (n: an integer)) phase shifters and 180° ((2n+1)π) phase shifters. However, the phases to be shifted are not limited to 90° and −90°.

On the other hand, the phase $\theta_1$ can be in the range of $2\pi n$ to $(2n+1)\pi$, and the other phase $\theta_2$ will have a phase difference of $\pi$ or $-\pi$ relative to the phase of $\theta_1$. Phase areas of more than two can be given to the $\theta_1$ of the contiguous part.

Figure 12:
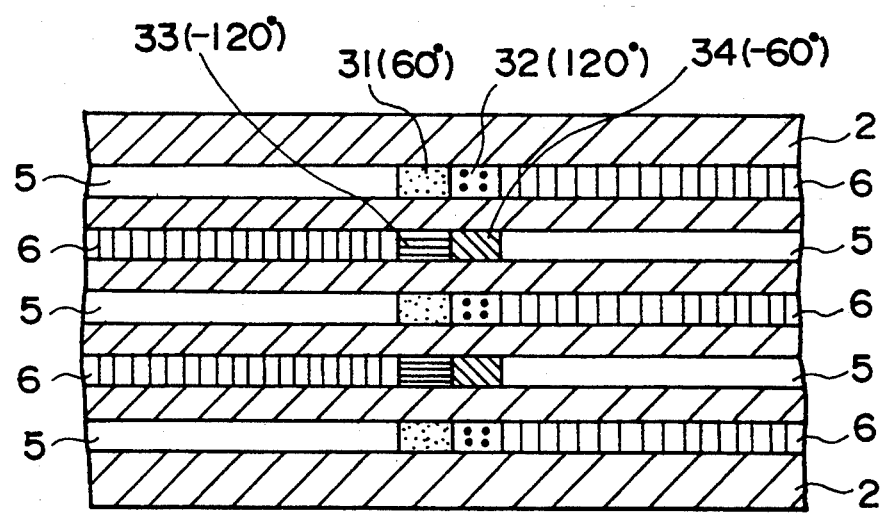
FIG. 12 is a plan view of an optical mask showing a first concrete example in a fourth embodiment according to the present invention.

For example, as shown in FIG. 12, in a case where a plurality of contiguous parts of phase shifters, 5 and 6, of 0° and 180° are disposed in line in the pattern width direction, a 60° phase shifter 31 and a 120° phase shifter 32 are disposed in the line direction in a contiguous side, and on the opposite part of the light shielding film 2 from the 60° phase shifter 31 in the line width direction, a −120° phase shifter 33 is disposed and on the opposite side of the light shielding film 2 from the 120° phase shifter 32, a −60° phase shifter 34 is disposed. Such dispositions will be repeated along a plurality of contiguous parts.

Figure 13:
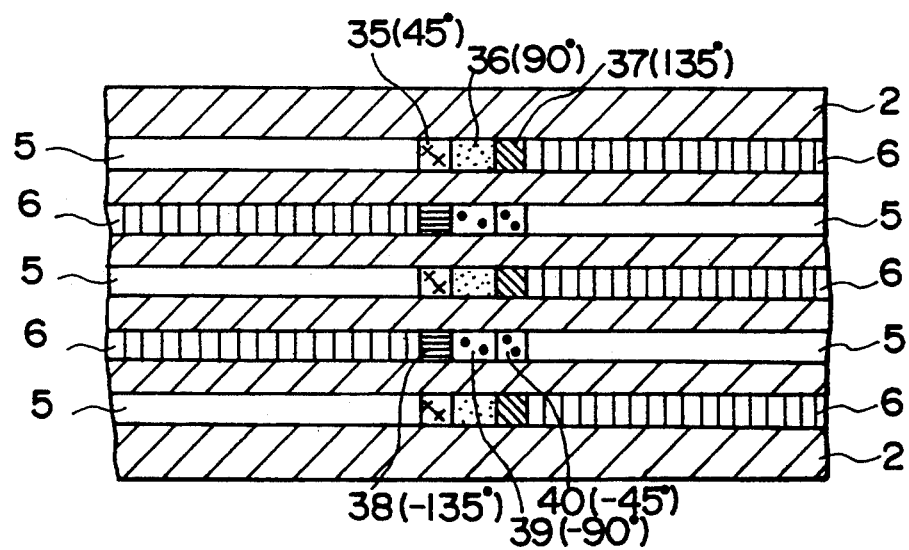
FIG. 13 is a plan view of an optical mask showing a second concrete example in the fourth embodiment according to the present invention.

When three phase shifters are to be formed in a contiguous part of the phase shifters 5 and 6 of 0° and 180°, as shown in FIG. 13, for example, a 45—phase shifter 35, a 90° phase shifter 36 and a 135—phase shifter 37 are formed in a line direction, and in the adjacent contiguous part, in the same direction, a −135° phase shifter 38, a −90° phase shifter 39 and a −45° phase shifter 40 will be disposed.

With these optical masks, almost the same effect as those obtained in the above-mentioned embodiments can be obtained.

In the manufacture of phase shifters such as 0°, 180°, 90°, etc., errors of 5% or less can occur, so that the value of $\theta_1$, in the range of $2\pi n$ to $(2n+1)\pi$, will be decided in consideration of the above-mentioned errors.

Other Embodiment

In the above-mentioned embodiments SiO$_2$ films of different film thicknesses are formed on a quartz substrate and the phase shift angle of a phase shifter is adjusted by the thickness of the film. However, it is also possible to obtain a similar effect by providing recessed parts formed on the quartz substrate and the phase shift angle can be adjusted by the depth of the recessed part.

When an exposure is performed with an optical mask as described in the above using a reduction projection exposure system, as shown in FIG. 14, a mask M is disposed between a condenser lens 41 and a projection lens 42, and a photoresist 45 on a wafer is irradiated with a light from a light source 43 transmitting through a diaphragm 44, the condenser lens 41, the optical mask M, and the projection lens 42. Then, the pattern of the optical mask M is transcribed on the photoresist 45 as a latent image.

What is claimed is:

1. An optical mask comprising:
   light shielding patterns formed in an irradiated region of light of the optical mask;
   light transparent patterns formed adjacent to light shielding patterns in the irradiated region of light of the optical mask, each of said light transparent patterns including
   a $2\pi n$ (n: an integer) phase shifter pattern not shifting a phase of an incident light,
   a $\pi(2n+1)$ phase shifter for shifting the phase of the incident light by $\pi$,
   one of an intermediate phase shifter pattern for shifting the phase of the incident light by an intermediate phase shift angle between $2\pi n$ and $\pi(2n+1)$ and a reversed intermediate phase shifter pattern for shifting the phase of the incident light by a reversed phase angle by $\pi$, positive or negative, relative to the intermediate phase shift angle of said intermediate phase shifter pattern.

2. An optical mask according to claim 1, wherein said intermediate phase shifter patterns and said reversed intermediate phase shifter patterns are respectively and separately formed in a plurality of contiguous parts of said $2\pi n$ phase shifter patterns and corresponding $\pi(2n+1)$ phase shifter patterns of the same light transparent patterns.

3. An optical mask according to claim 1, wherein said intermediate phase shifter patterns and said reversed intermediate phase shifter patterns are disposed alternately in a substantially straight line direction through said light shielding patterns.

4. An optical mask according to claim 1, wherein ones of said intermediate phase shifter patterns and corresponding ones of said reversed intermediate phase shifter patterns are disposed in the vicinity of each other having one of said light shielding areas in between.

5. An optical mask according to claim 1, wherein said intermediate phase shift angle is one of $2\pi n - \pi/2$ and $2\pi n + 3\pi/2$.

6. An optical mask according to claim 1, wherein each of said intermediate phase shifter patterns comprises an area being divided into a first plurality of divided areas, and in respective ones of said first plurality of divided areas, phase shifter patterns of different phase shift angles from each other are disposed, and each of said reversed intermediate phase shifter patterns is divided into a second plurality of divided areas corresponding to those in the first plurality of divided areas of said each intermediate phase shifter pattern, and in respective ones of said second plurality of divided areas, there are disposed phase shifter patterns having phase shift angles being reversed by $\pi$, positive or negative, relative to the corresponding phase shift angles in the respective ones of said first plurality of divided areas of said each intermediate phase shifter pattern.

7. An optical mask according to claim 1, wherein phase differences among said $2\pi n$ phase shifter patterns, said $\pi(2n+1)$ phase shifter patterns, said intermediate phase shifter patterns, and said reversed intermediate phase shifter patterns are adjusted by the differences in the thicknesses of transparent films formed on the optical mask.

8. An optical mask according to claim 1, wherein an error in phase angles of less than 5% occurs in said $2\pi n$ phase shifter patterns and in said $\pi(2n+1)$ phase shifter patterns.

9. An optical mask according to claim 1, wherein the widths of said intermediate phase shifter patterns and said reversed intermediate phase shifter patterns are made wider than those of said $2\pi n$ phase shifter patterns and said $\pi(2n+1)$ phase shifter patterns.

10. An exposure method using an optical mask, Said method comprising the steps of:
   irradiating an incident light on light shielding patterns which reduce the incident light passing through; and
   irradiating the incident light on light transparent patterns formed adjacent to the light shielding patterns to form light patterns, said step of irradiating the incident light including
      maintaining a phase of the incident light using $2\pi n$ (n: an integer) phase shifter patterns,
      shifting the phase of the incident light by $\pi$ using $\pi(2n+1)$ phase shifter patterns,
      shifting the phase of the incident light by a first angle between $2\pi n$ and $\pi(2n+1)$ using intermediate phase shifter patterns, and
      shifting the phase of the incident light by a second angle reversed by $\pi$, relative to the first angle.

11. An optical mask for receiving incident light, said optical mask comprising:
   a plurality of light shielding patterns spaced apart and arranged in parallel to one another, to reduce the incident light from passing through; and
   a plurality of light transparent patterns respectively formed adjacent to and between said plurality of light shielding patterns, each of said plurality of light transparent patterns arranged in parallel to one another and including
      a $2\pi n$ (n: an integer) phase shifter pattern, to maintain a phase of the incident light,
      a $\pi(2n+1)$ phase shifter pattern to shift the phase of the incident light by $\pi$, and
      a middle phase shifter pattern connecting said each $2\pi n$ shifter pattern with said each $\pi(2n+1)$ phase shifter pattern in a first direction, said middle phase shifter pattern being one of an intermediate phase shifter pattern to shift the phase of the incident light by an intermediate phase angle between $2\pi n$ and $\pi(2n+1)$ and a reversed phase shifter pattern to shift the phase of the incident light by a reversed phase angle by $\pi$, relative to the intermediate phase angle;
   said optical mask having both said intermediate phase shifter patterns and said reversed phase shifter patterns.

12. The optical mask according to claim 11, wherein said intermediate phase shifter patterns and said reversed phase shifter patterns are alternately arranged in a second direction substantially orthogonal to the first direction.

13. The optical mask as claimed in claim 11, wherein said intermediate phase angle is one of $2\pi n - \pi/2$ and $2\pi n + 3\pi/2$.

14. The optical mask as claimed in claim 11, wherein:
   each of said intermediate phase shifter patterns comprises:
      first and second shift patterns arranged side by side in the first direction and having different phases from one another; and
   each of said reversed phase shifter patterns comprises:
      third and fourth phase shift patterns arranged side by side in the first direction and having different phases from one another;
   said third and fourth phase shift patterns to shift the phase of the incident light by $\pi$ relative to said first and second phase shift patterns, respectively, said first and third phase shift patterns, and said second and fourth phase shift patterns being alternately arranged in the second direction.

15. The optical mask as claimed in claim 11, wherein:
   each of said intermediate phase shifter patterns comprises:
      first, second and third shift patterns arranged side by side in the first direction and having different phases from one another; and
   each of said reversed phase shifter patterns comprises:
      fourth, fifth and sixth phase shift patterns arranged side by side in the first direction and having different phases from one another;
   said fourth, fifth and sixth phase shift patterns to shift the phase of the incident light by $\pi$ relative to first second and third phase shift patterns, respectively, said first and fourth phase shift patterns, said second and fifth phase shift patterns, and said third and sixth phase shift patterns being alternately arranged in the second direction.

16. An optical mask for receiving incident light, said optical mask comprising:
   a light shielding pattern to reduce the incident light passing through;
   a first group having a first plurality of $2\pi n$ (n: an integer) phase shifter patterns to maintain a phase of the incident light and a first plurality of $\pi(2n+1)$ phase shifter patterns to shift the phase of the incident light by $\pi$, spaced apart by said light shielding pattern and alternately arranged with said first plurality of $2\pi n$ phase shifter patterns in a first direction, and
   a second group having a second plurality of $2\pi n$ (n: an integer) phase shifter patterns to maintain a phase of the incident light and a second plurality of $\pi(2n+1)$ phase shifter patterns to shift the phase of the incident light by $\pi$, spaced apart by said light shielding pattern and alternately arranged with said second plurality of $2\pi n$ phase shifter patterns in the first direction;
   an intermediate phase shifter pattern to shift the phase of the incident light by an intermediate phase angle between $2\pi n$ and $\pi(2n+1)$, extending in the first direction and contacting each phase shifter pattern of said first group;
   a reversed phase shifter pattern to shift the phase of the incident light by a reversed phase angle by $\pi$, relative to the intermediate phase angle, extending in the first direction and contacting each phase shifter pattern of said second group; and
   said first group being to a side of said second group in a second direction orthogonal to the first direction, such that ones of said $2\pi n$ phase shifter patterns and ones of said $\pi(2n+1)$ phase shifter patterns are respectively situated linearly in the second direction.

* * * * *

UNITED STATES PATENT AND TRADEMARK OFFICE
CERTIFICATE OF CORRECTION

PATENT NO. : 5,428,478
DATED : June 27, 1995
INVENTOR(S) : HANYU et al.

Figure 5A:
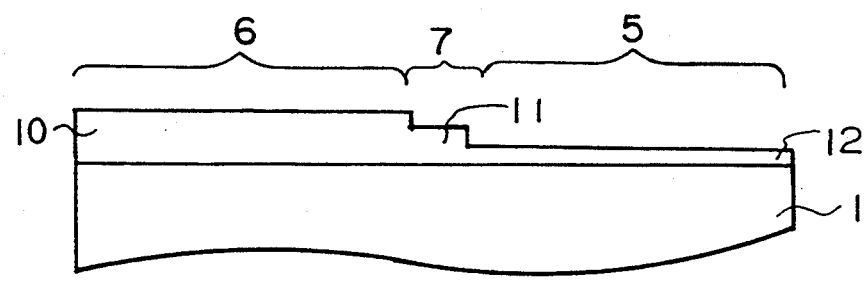
FIG. 5A is a cross sectional view of the optical mask shown in FIG. 4 taken on line II—II.
Figure 5B:
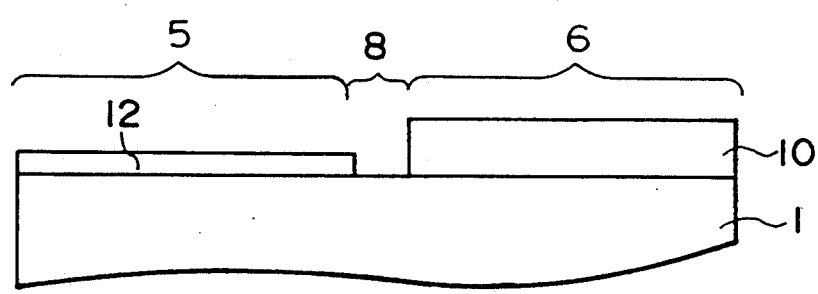
FIG. 5B is a cross sectional view of what is shown in FIG. 4 taken on line III—III.
Figure 5C:
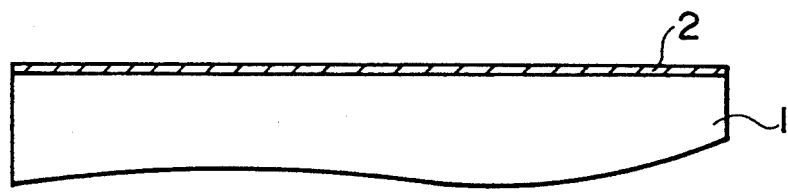
FIG. 5C is a cross sectional view of what is shown in FIG. 4 taken on line IV—IV.
Figure 5D:
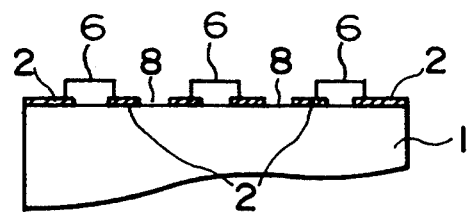
FIG. 5D is a cross sectional view of what is shown in FIG. 4 taken on line V—V.

It is certified that error appears in the above-indentified patent and that said Letters Patent is hereby corrected as shown below:

Column 3, line 37, indent before Fig. 5A.

Signed and Sealed this

Thirty-first Day of October 1995

Attest:

BRUCE LEHMAN

Attesting Officer

Commissioner of Patents and Trademarks